United States Patent [19]

Bakewell

[11] Patent Number: 4,839,001

[45] Date of Patent: Jun. 13, 1989

[54] ORIFICE PLATE AND METHOD OF FABRICATION

[75] Inventor: Joseph J. Bakewell, Boxford, Mass.

[73] Assignee: Dynamics Research Corporation, Wilmington, Mass.

[21] Appl. No.: 168,665

[22] Filed: Mar. 16, 1988

[51] Int. Cl.[4] .............................................. C25D 1/08
[52] U.S. Cl. ..................................................... 204/11
[58] Field of Search .......................................... 204/11

[56] References Cited

U.S. PATENT DOCUMENTS 4,246,076  1/1981  Gardner ................................ 204/11

Primary Examiner—T. M. Tufariello
Attorney, Agent, or Firm—Weingarten, Schurgin, Gagnebin & Hayes

[57] ABSTRACT

An orifice plate and method of fabrication are provided in which the plate is constructed of two electroformed layers of metal. Onto a conductive mandrel a first layer of a first metal is electroformed to provide a support layer having a selected hole pattern. The first layer is then plated with a thick layer of a second metal and removed from the conductive mandrel exposing the bottom surface of the first layer. On the exposed bottom surface, a thin second layer of the first metal is electroformed to produce a pattern of holes of a selected smaller cross section in cooperation with the hole pattern of the first layer of the first metal. The thick layer of the second metal is then etched away, producing a thin metal orifice plate having a pattern of small holes of a selected cross section and supported between the holes by an additional, thicker layer of the same metal.

12 Claims, 1 Drawing Sheet

ORIFICE PLATE AND METHOD OF FABRICATION

FIELD OF THE INVENTION

This invention relates to orifice plates and in particular to an orifice plate and method of fabricating such a plate from two electroformed layers of metal.

BACKGROUND OF THE INVENTION

In a number of industrial applications thin metal plates with very fine holes are needed. For example, orifice plates, also known as nozzle plates, are used in the ink-jet printing industry. These plates consist of thin sheets of metal with a pattern holes of typically circular cross sections 1 to 2 mils in diameter. For high resolution printing, these holes must be closely spaced. For example, an orifice plate might be six inches long by one-half inch wide and have along its center a five inch long array of circular holes each of which are 1 to 2 mils in diameter and which are spaced 4 to 5 mils apart from center to center.

A preferred method for making such plates is to use electroformed nickel. The electroform process can produce the hole cross sections found to be helpful in the formation of ink droplets, and nickel is compatible with corrosive inks sometimes used for ink-jet printing.

Because of the small sizes and the close spacing of the holes, however, the mounting and support of orifice plates is critical. Orifice plates are typically electroformed to a thickness of about 1 mil. Because of this thickness the thin plate must be supported very close to the holes. One manner is through use of a bi-metal process. For example, a thin nickel orifice plate is electroformed onto a stainless steel plate of several mils thickness. Stainless steel is then chemically etched away from the area directly behind the holes, leaving the nickel orifice plate closely supported by the attached stainless steel plate. The problem with this process, however, is that it is very difficult to etch away the stainless steel in a manner which leaves proper support between adjacent holes. The structure therefore is very weak in the immediate area of the holes.

SUMMARY OF THE INVENTION

The present invention is an orifice plate and a method of fabricating such a plate from two electroformed layers of nickel. A first layer of nickel is electroformed onto a conductive mandrel to form a support layer with a selected hole pattern. Copper is plated over the nickel layer until the holes are completely closed over. The mandrel is removed and a second layer of nickel is electroformed onto the surface formerly joined to the mandrel in such a way as to form an orifice layer with a pattern of smaller holes of a selected cross section in alignment with the pattern of holes of the first nickel layer. The copper is then etched away to reveal a thin orifice plate of nickel, with the pattern of small holes rigidly supported around their periphery by an additional, thicker layer of nickel.

DESCRIPTION OF THE DRAWINGS

The present invention will be more fully understood by referring to the following detailed description in conjunction with the accompanying drawings, of which.

DETAILED DESCRIPTION OF THE INVENTION

For purposes of this detailed description the fabrication of an orifice plate having holes of circular cross sections 1 mil in diameter and 4 mils center-to-center spacing is described. A nickel layer between 1.5 and 2 mils thick and having holes of approximately 2 mils in diameter and spaced 4 mils apart, center-to-center, is formed first. A second layer approximately 1 mil thick is formed on the first layer and narrows the holes to the desired 1 mil diameter. The result is a second layer 1 mil thick with the desired 1 mil diameter holes, and a first thicker layer supporting the second layer between the holes.

Figure 1A:
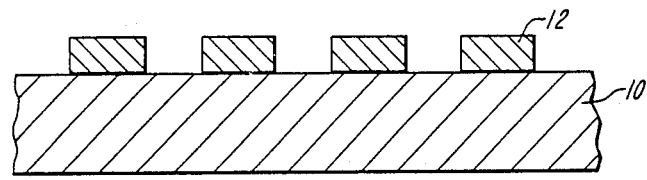
FIGS. 1A through 1F are diagrammatic representations of the method for fabricating orifice plates in accordance with the invention.
Figure 1B:
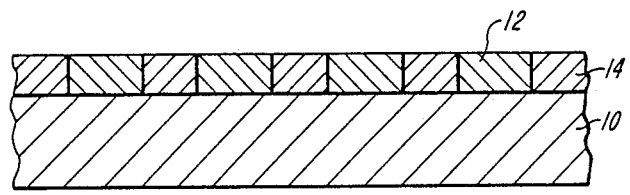
Figure 1C:
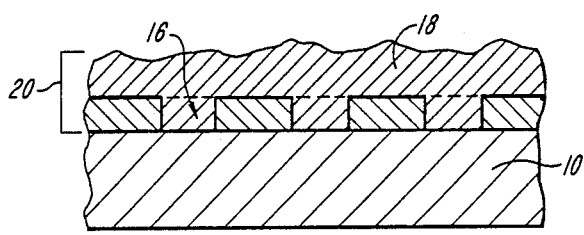
Figure 1D:
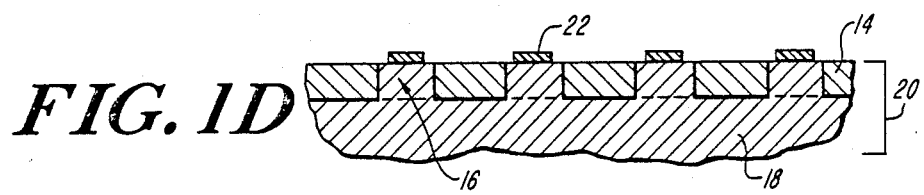
Figure 1E:
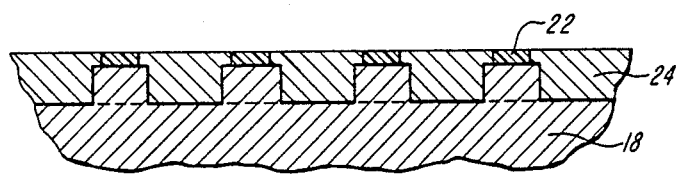
Figure 1F:

Referring to FIG. 1A, on a conductive mandrel 10, made of stainless steel for example, a pattern of 2 mil diameter raised dots 12 corresponding to the desired pattern of holes is created from thick film photoresist. Referring to FIG. 1B, nickel 14 is then electroformed onto the mandrel 10 to a thickness of approximately 2 mils, about the same height as the photoresist dots 12. The thick film photoresist dots 12 are removed, forming holes 16 (FIG. 1C), and the plate is immersed into a copper plating bath where it is plated with copper 18 until the holes 16 are completely filled in and covered. The mandrel 10 is removed from the nickel/copper sandwich 20 (FIG. 1D), and the sandwich is turned over. In registration with the original holes 16, a thin film photoresist pattern of 1 mil diameter raised dots 22 is applied to the side of the nickel/copper sandwich which had been attached to the conductive mandrel 10. In FIG. 1E, a second 1 mil layer of nickel 24 is electroformed around the thin film photoresist dots 22. Finally, the thin film photoresist dots 22 are removed and the copper plating 18 is etched away with an acid appropriate for copper. As shown in FIG. 1F, the final result is an orifice plate 26 made completely of nickel and having a thickness of 3 mils, with a pattern of 1 mil diameter holes of correct cross section and with an additional thickness of metal between the closely spaced holes.

The above description is given by way of example and is a preferred embodiment of the present invention. However, it will occur to those skilled in the art that modifications and alternatives can be practiced within the spirit of the invention. In particular, it will occur to one skilled in the art that orifice plates of other thicknesses and hole cross sections can be produced by the present invention, and that the present invention is not limited to orifice plates for ink-jet printers but also encompasses other thin metal orifice plates having fine, closely spaced holes. Accordingly, the scope of the present invention is limited only by the following claims.

What is claimed is:

1. An orifice plate, comprising:
   a first layer of a metal electroformed to a desired thicken to form a desired pattern of holes of selected first cross section greater than 2 mils in diameter and spaced apart 5 mils or less center to center; and
   a second layer of the metal electroformed onto the first layer to a thickness of 2 mils or less to form a pattern of holes of selected cross-section 2 mils or less in diameter in registration with the holes of the first layer.

2. The invention of claim 1, wherein the metal is nickel.

3. An orifice plate, comprising:
a first layer of a metal electroformed to a desired thicken to form a desired pattern of circular holes greater than 2 mils in diameter and spaced apart 5 mils or less center to center; and
a second layer of the metal electroformed onto the first layer to a thickness of 2 mils or less to form a pattern of circular holes 2 mils or less in diameter in registration with the holes of the first layer.

4. The invention of claim 3, wherein the metal is nickel.

5. A method for fabricating orifice plates, comprising the steps of:
electroforming onto a surface a first layer of a first metal to a desired thickness to form a desired pattern of holes of selected cross section;
depositing a layer of a second metal over the first layer of first metal until the holes of the first layer of first metal are filled;
removing the first layer of first metal from the surface to expose a side of the first layer of first metal;
electroforming to a desired thickness a second layer of the first metal over the exposed side of the first layer of first metal to form a pattern of holes of smaller cross section in registration with the holes of the first layer of first metal; and
removing the layer of second metal.

6. The method of claim 5, wherein the first metal is nickel.

7. The method of claim 5, wherein the second metal is copper.

8. The method of claim 5, wherein said cross sections are circular.

9. A method for fabricating orifice plates, comprising the steps of:
creating on a conductive mandrel a pattern of raised thick film photoresist dots of selected first cross section, wherein the dots correspond to a desired pattern of holes;
electroforming a first layer of a first metal to a desired thickness onto the mandrel and around the thick film photoresist dots;
removing the thick film photoresist dots to expose a pattern of holes in the first layer of first metal;
plating a layer of a second metal over the first layer of first metal until the holes of the first layer of first metal are filled;
removing the mandrel from the first layer of first metal to expose a surface of the first layer of first metal;
applying to the exposed surface at the first layer of first metal in registration with the holes of the first layer of first metal a pattern of raised thin film photoresist dots of selected second cross section smaller than the cross section of the holes of the first layer of first metal;
electroforming a second layer of the first metal over the exposed side of the first layer of first metal until a selected thickness is achieved;
removing the thin film photoresist dots; and
removing the layer of second metal.

10. The method of claim 9, wherein the first metal is nickel.

11. The method of claim 9, wherein the second metal is copper.

12. The method of claim 9, wherein said cross sections are circular.

* * * * *

UNITED STATES PATENT AND TRADEMARK OFFICE
CERTIFICATE OF CORRECTION

PATENT NO. : 4,839,001
DATED : June 13, 1989
INVENTOR(S) : Joseph J. Bakewell

It is certified that error appears in the above-identified patent and that said Letters Patent is hereby corrected as shown below:

In Column 2, line 62, "thicken" should read --thickness--.

In Column 3, line 7, "thicken" should read --thickness--

Signed and Sealed this

Ninth Day of June, 1992

*Attest:*

DOUGLAS B. COMER

*Attesting Officer*     *Acting Commissioner of Patents and Trademarks*